US007037116B1

(12) United States Patent
Liao et al.

(10) Patent No.: US 7,037,116 B1
(45) Date of Patent: May 2, 2006

(54) SOCKET CONNECTOR HAVING MULTI-PIECE HOUSING

(75) Inventors: Fang-Jwu Liao, Tu-Chen (TW); Igor Polnyi, Aurora, IL (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/970,894

(22) Filed: Oct. 21, 2004

(51) Int. Cl.
*H01R 12/00* (2006.01)
(52) U.S. Cl. .......................................... 439/71; 439/940
(58) Field of Classification Search .................. 439/68, 439/69, 70, 71, 73, 940
See application file for complete search history.

(56) References Cited

U.S. PATENT DOCUMENTS

| | | | |
|---|---|---|---|
| 4,936,783 A * | 6/1990 | Petersen | 439/70 |
| 6,196,849 B1 | 3/2001 | Goodwin | |
| 6,533,592 B1 * | 3/2003 | Chen et al. | 439/135 |
| 6,561,825 B1 * | 5/2003 | McHugh et al. | 439/135 |
| 6,679,707 B1 * | 1/2004 | Brodsky et al. | 439/71 |
| 6,786,738 B1 | 9/2004 | Lin | |

* cited by examiner

*Primary Examiner*—Ross Gushi
(74) *Attorney, Agent, or Firm*—Wei Te Chung

(57) ABSTRACT

A socket connector (100) for electrically connecting a central process unit (CPU) to a printed circuit board includes a housing (1), and a number of electrical contacts (2) received in the housing. The housing, being of a frame defining an opening, is constructed by joining pieces of separate housing-plates (1a, 1b, 1c, 1d) end by end. Each housing-plate defines a number of channels (105) therethrough. The electrical contacts are respectively received in the channels, and each has a contact beam (21) projecting out to electrically connect with the CPU.

9 Claims, 5 Drawing Sheets

SOCKET CONNECTOR HAVING MULTI-PIECE HOUSING

BACKGROUND OF THE INVENTION

1. Field of the Invention

The present invention relates to a socket connector for electrically connecting a central process unit (CPU) to a printed circuit board (PCB).

2. Description of Related Art

Socket connectors for mounting CPUs on a PCB are well known. The socket connector may be mounted to the PCB, while the CPU is snap-fitted into the socket connector. One advantage of this arrangement is that, unlike CPUs that are soldered directly on the PCB, a CPU that is mounted in a socket connector can be easily disconnected from the PCB for testing and replacement. However, the relatively dense layout and small size of electrical contacts on some CPUs necessitates precise alignment both between the socket connector and the PCB, and between the CPU and the socket connector.

In general, a socket connector includes an insulative housing and a plurality of electrical contacts received in the insulative housing. For example, U.S. Pat. Nos. 6,196,849 and 6,786,738 disclose such a socket connector comprising a housing defining an array of holes therethrough corresponding to an array of contacts of the CPU, and a plurality of electrical contacts received in the holes. The housing that is molded from an insulative material is of a single-piece structure. However, as the housing is a thin, flat plate, after it is molded, during the cooling course, it will be warped. Thus the holes in the housing will be shoved or skewed. As a result, the electrical contacts cannot be placed in the holes correctly. Or even through the electrical contacts are placed into the holes, precise alignment between the CPU and the socket connector cannot be ensured. That causes electrical connection between the CPU and the PCB to become unreliable.

Thereby, an improved socket connector is required to overcome the disadvantages of the prior art.

SUMMARY OF THE INVENTION

An object of the present invention is to provide a socket connector which has reliable structure and can perform securely electrical connection between a central process unit (CPU) and a printed circuit board (PCB).

In order to achieve above-mentioned objects, a socket connector in accordance with a preferred embodiment of the present invention includes a housing, and a number of electrical contacts received in the housing. The housing, being of a frame defining an opening, is constructed by joining pieces of separate housing-plates end by end. Each housing-plate defines a number of channels therethrough. The electrical contacts are respectively received in the channels, and each has a contact beam projecting out to electrically connect with the CPU.

Other objects, advantages and novel features of the present invention will become more apparent from the following detailed description of the present embodiment when taken in conjunction with the accompanying drawings.

DETAILED DESCRIPTION OF THE INVENTION

Figure 1:
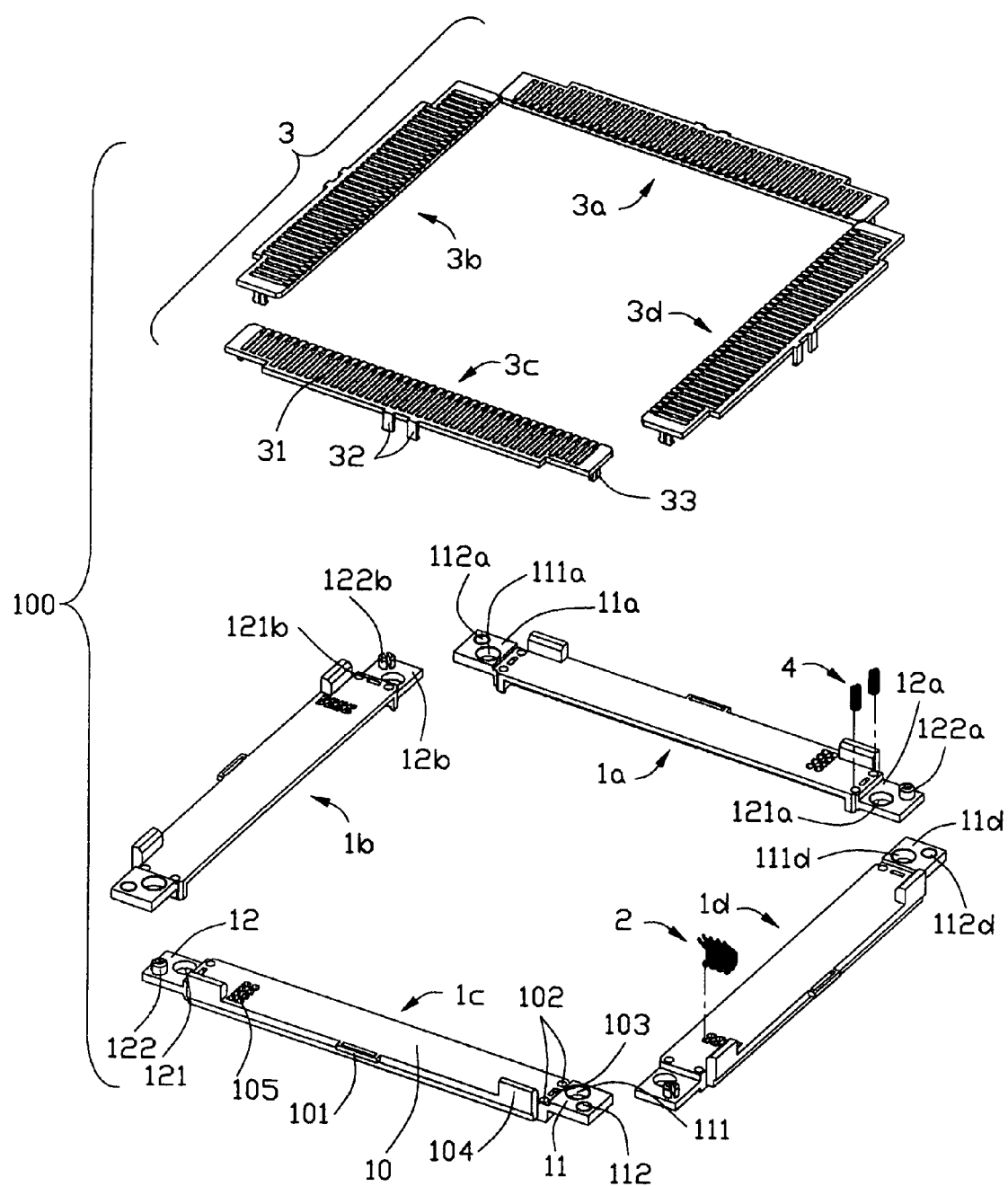
FIG. 1 is a simplified, exploded, perspective view of a socket connector in accordance with the preferred embodiment of the present invention.

Reference will now be made to the drawing figures to describe the present invention in detail.

Referring to FIG. 1, a socket connector 100 in accordance with the preferred embodiment of the present invention comprises a housing 1, a plurality of electrical contacts 2 to be received in the housing 1, a cover 3 for closing the electrical contacts 2, and springs 4 for linking the cover 3 and the housing 1.

The housing 1 comprises four pieces of separate housing-plates 1a, 1b, 1c, 1d. As each piece of housing-plate 1a, 1b, 1c, 1d is much smaller than a single-piece housing, it will suffer a littler warp during the cooling course after it is molded. Therefore flatness and reliability of the housing 1 can be controlled more easily. As the four housing-plates 1a, 1b, 1c, 1d are of the same structure, we will refer to the housing-plate 1c to be typical of all the housing-plates 1a, 1b, 1c, 1d to describe their structure. Each housing-plate is longitudinal and comprises a first end 11, a second end 12, and a middle portion 10. The two ends 11 and 12 are both thinner than the middle portion 10, wherein the first end 11 has an under surface upper than that of the middle portion 10 and the second end 12 has an upper surface lower than that of the middle portion 10. The first end 11 defines a binding hole 112 and a first aligning hole 111. The second end 12 has a binding tab 122 and a second aligning hole 121.

Figure 3:
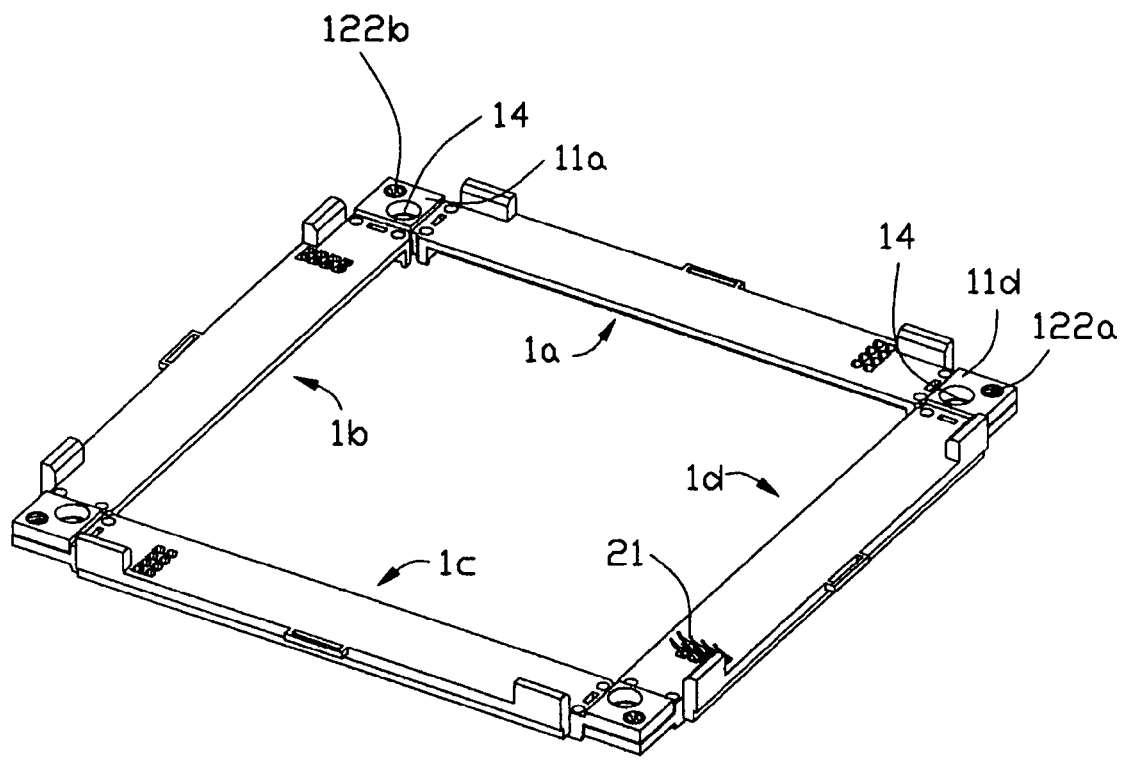
FIG. 3 is a partly assembled view showing housing-plates of FIG. 1 assembled to form a housing.

Referring to FIGS. 1 and 3, the four pieces of housing-plates 1a, 1b, 1c, 1d are joined end by end. Now, a process how to join the housing-plate 1a with other two housing-plates will be described as an example. The housing-plates 1a and 1b are disposed in a position that they are perpendicular to each other. Then the first end 11a of the housing-plate 1a is overlapped onto the second end 12b of the housing-plate 1b, together to make up a thickness proximate to that of the middle portion 10, while the first aligning hole 11a aligning with second aligning hole 121b to form a unitary hole 14, and the binding tab 122b being received in the binding hole 112a to bind the two plates 1a, 1b. As the binding tab 122b has a diameter slightly larger than that of the binding hole 112a, the two plate 1a, 1b are toughly assembled together after the binding tab 122b is forced into the binding hole 112a. Alike, the housing-plates 1a and 1d are joined in a similar way, that the second end 12a of the housing-plate 1a is overlapped to the first end 12d of the housing-plate 1d with the second aligning hole 121a aligning with the first aligning hole 111d and the binding tab 122a received within the binding hole 112d.

The middle portion 10 of each housing-plate defines a plurality of channels 105 (only partially shown) therethrough for receiving the electrical contacts 2. Each electrical contact 2 has a contact beam 21 to project out of the housing 1 to electrically connect with a central process unit (CPU) (not shown), as shown in FIG. 3.

Figure 2:
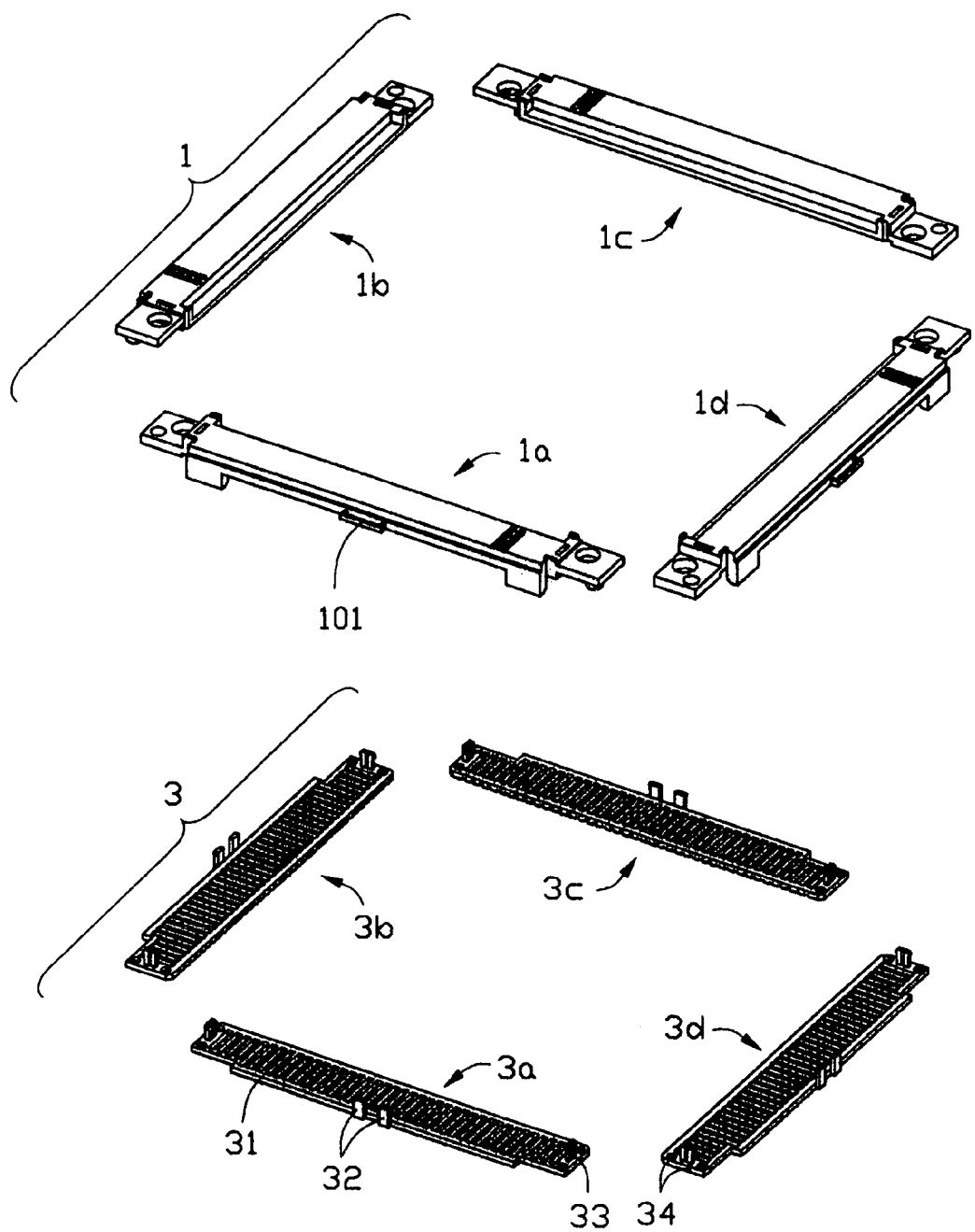
FIG. 2 is an inverted perspective view of FIG. 1, but springs and electrical contacts are removed.

At the middle portion 10 adjacent to the two ends 11 and 12 respectively, there are a rim 104 protruding from outer edges thereof, a pair of spring receiving holes 102 for accommodating one ends of the springs 4, and a recess 103 between the spring receiving holes 102. Additionally, an ear 101 projects outwardly from a longitudinal middle of the middle portion 10. The ear 101 defines a slot therethrough. Corresponding to the four pieces of housing-plates 1a, 1b, 1c, 1d, the cover 3 comprises four pieces of cover-plates 3a, 3b, 3c, 3d. As shown in FIG. 2, each cover-plate has a pair of middle legs 32 and a pair of end legs 33 at each end thereof to be respectively inserted into the slot of the ear 101 and recess 103 in housing-plate, and defines second spring receiving holes 34 for accommodating the other ends of the springs 4. Then the cover-plates are assembled to corresponding housing-plate to cover the middle portion 10.

Figure 4:
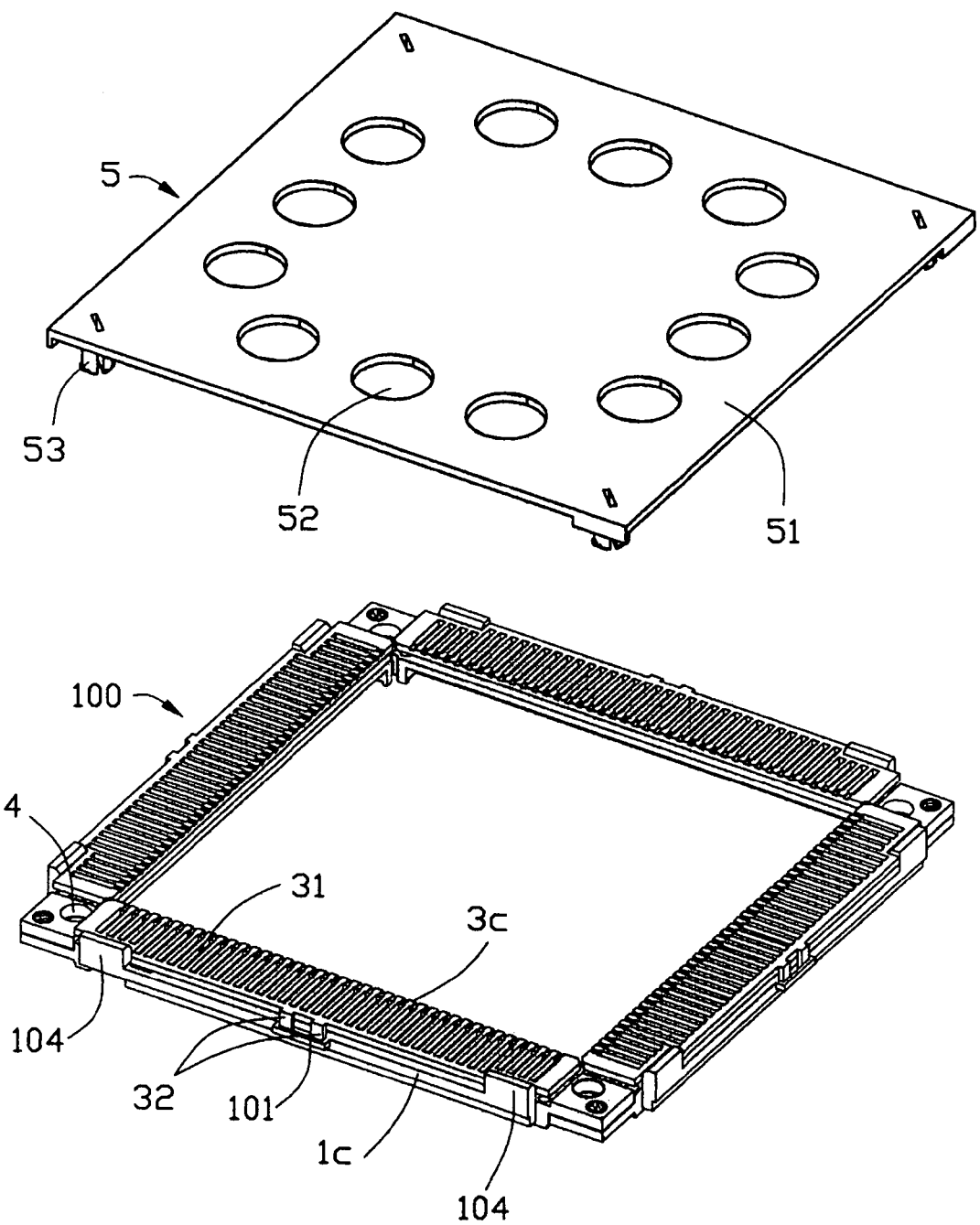
FIG. 4 is view showing the socket connector of FIG. 1 after assembled, and a pick up cap to be assembled to the socket connector.

The assembled view of the socket connector 100 is shown in FIG. 4. The cover-plates are enabled to float up and down relative to the housing-plates via the springs 4 and define a plurality of parallel slots 31 therethrough for the contact beams 21 (shown in FIG. 3) to pass through while the cover-plates floating down. The slots 31 are defined along a breadth direction perpendicular to the longitudinal direction of corresponding housing-plate, each slot 31 corresponding to an array of contact beams 21 along the breadth direction. Thus, when the CPU is assembled on the socket connector 100, the cover 3 is pressed to float down and the contact beams 21 project out of the cover 3 through the slot 31 to electrically connect the CPU, wherein the CPU is restricted in a flange formed by the rims 104 against unexpected displacement. But before the socket connector 100 is loaded, for example, during carrying or transmitting of the socket connector 100, the cover 3 is supported by the springs 4 in a position closing the contact beams 21 to prevent them from accidental damage.

Figure 5:
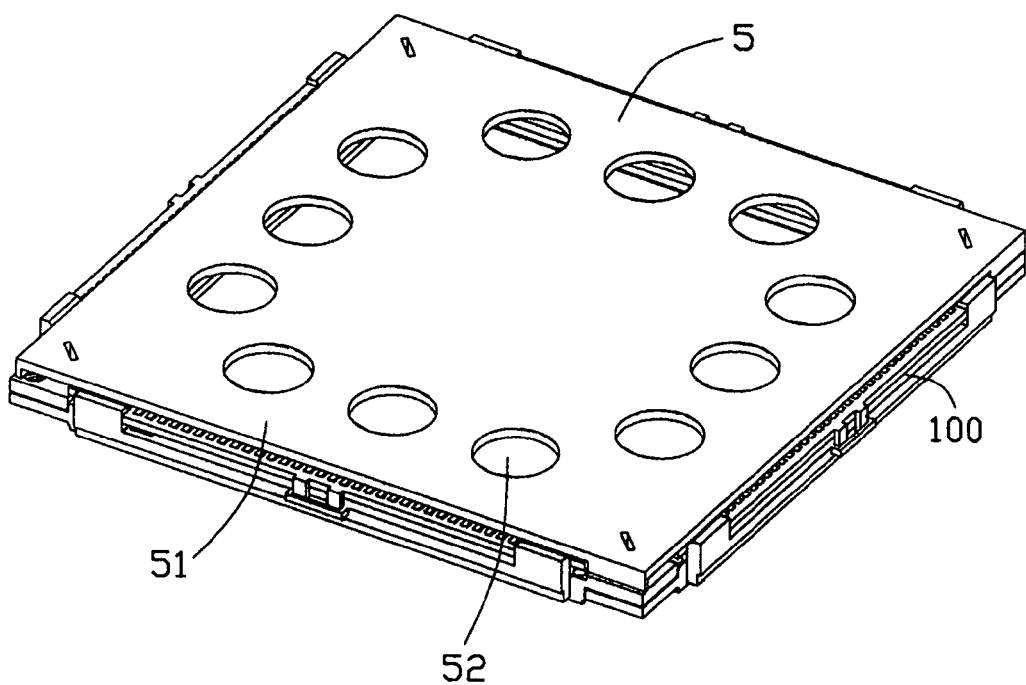
FIG. 5 is an assembled view of FIG. 4, showing the pick up cap being assembled on the socket connector.

Moreover, FIG. 4 shows a pick up cap 5 to be assembled to the socket connector 100. The pick up cap 5 comprises a flat plate 51 defining a circle of through holes 52 therein, and four retention posts 53 respectively extending down from four corners of the flat plate 51 to be received in the unitary hole 14 of the housing 1 to retain the pick up cap 5 to the socket connector 100. FIG. 5 shows the pick up cap 5 being assembled to the socket connector 100. During transmitting of the socket connector 100, the pick up cap can be catch up by a cupula. Thus, in virtue of the pick up cap 5, the socket connector 100 can be picked up conveniently.

The disclosure is illustrative only, changes may made in detail, especially in matter of shape, size, and arrangement of parts within the principles of the invention.

What is claimed is:

1. A socket connector assembly comprising;
   a housing assembly including a plurality of discrete elongated housing plates joined in an end-to-end manner and commonly defining a polygonal configuration; and
   a plurality of terminals arranged in rows and columns in each of said housing plates; wherein
   each of the terminals defines an upper end section extending above an upper face of the housing plate for engagement with an electronic component.

2. The socket connector assembly as described in claim 1, wherein the discrete housing plates are same with one another while two opposite ends of the housing plate are complementary with each other so as to be compliantly coupled to the corresponding ends of the neighboring housing plates.

3. The socket connector assembly as described in claim 1, wherein said discrete housing plates are directly connected to one another.

4. The socket connector assembly as described in claim 3, wherein each of the neighboring housing plates being joined by ends is overlapped at the ends thereof.

5. The socket connector assembly as described in claim 4, wherein one of the overlapped ends has a tab and the other defines a hole receiving said tab.

6. The socket connector assembly as described in claim 1, wherein the housing assembly defines a center cavity among said housing plates, and a pick-up cap is attached to the housing assembly to cover at least a center portion of said center cavity.

7. The socket connector assembly as described in claim 6, wherein said pick-up cap defines a plurality of openings for heat dissipation.

8. A socket connector assembly comprising:
   a housing assembly defining a polygonal configuration with a plurality of terminals arranged in rows and columns in each of elongated sections of said polygonal configuration;
   a central cavity formed in said polygonal configuration and among the elongated sections; and
   a pick-up cap defining another polygonal configuration similar to said polygonal configuration and mounted to said housing assembly to cover at least a central portion of the housing assembly, wherein
   said pick-up cap defines a plurality of openings around said central portion to exposed a peripheral portion of the central cavity for heat dissipation while said elongated sections are still hidden under said pick-up cap.

9. A socket connector assembly comprising:
   a housing assembly defining a polygonal configuration with a plurality of terminals arranged in rows and columns in each of elongated sections of said polygonal configuration;
   a central cavity formed in said polygonal configuration and among the elongated sections; and
   a pick-up cap defining another polygonal configuration similar to said polygonal configuration and mounted to said housing assembly to cover at least a central portion of the housing assembly, wherein
   the elongated sections are end to end fastened to one another, and said pick-up cap includes fastening devices fixing to said ends.

* * * * *